(12) United States Patent
Lian et al.

(10) Patent No.: US 9,515,158 B1
(45) Date of Patent: Dec. 6, 2016

(54) SEMICONDUCTOR STRUCTURE WITH INSERTION LAYER AND METHOD FOR MANUFACTURING THE SAME

(71) Applicant: Taiwan Semiconductor Manufacturing Co., Ltd., Hsinchu (TW)

(72) Inventors: Cheng-Wei Lian, New Taipei (TW); Chih-Lin Wang, Zhubei (TW); Kang-Min Kuo, Zhubei (TW); Chih-Wei Lin, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/918,054

(22) Filed: Oct. 20, 2015

(51) Int. Cl.
*H01L 29/78* (2006.01)
*H01L 29/51* (2006.01)
*H01L 29/423* (2006.01)
*H01L 21/28* (2006.01)
*H01L 21/02* (2006.01)

(52) U.S. Cl.
CPC ....... *H01L 29/517* (2013.01); *H01L 21/02181* (2013.01); *H01L 21/28079* (2013.01); *H01L 21/28088* (2013.01); *H01L 21/28158* (2013.01); *H01L 29/42364* (2013.01); *H01L 29/513* (2013.01)

(58) Field of Classification Search
None
See application file for complete search history.

(56) References Cited

U.S. PATENT DOCUMENTS

| | | | | |
|---|---|---|---|---|
| 6,858,444 B2* | 2/2005 | Ahn | ................ | H01L 21/28291 257/E21.208 |
| 7,838,875 B1* | 11/2010 | Tsang | .................. | H01L 49/00 257/213 |
| 8,143,092 B2* | 3/2012 | Kumar | ................. | H01L 45/04 257/43 |
| 2002/0195643 A1* | 12/2002 | Harada | ............. | H01L 21/28176 257/310 |
| 2003/0057504 A1* | 3/2003 | Muraoka | .......... | H01L 21/28167 257/410 |
| 2004/0214365 A1* | 10/2004 | Joshi | .................. | H01L 29/4908 438/48 |
| 2006/0054950 A1* | 3/2006 | Baek | .................... | H01L 27/112 257/295 |
| 2006/0118858 A1* | 6/2006 | Jeon | .................. | H01L 21/28273 257/321 |
| 2010/0207243 A1* | 8/2010 | Kim | ................. | H01L 21/02178 257/532 |
| 2013/0062581 A1* | 3/2013 | May | ........................ | C09D 5/24 252/519.3 |

(Continued)

*Primary Examiner* — Michael Lebentritt
(74) *Attorney, Agent, or Firm* — Haynes and Boone, LLP

(57) ABSTRACT

A semiconductor structure and a method for forming the same are provided. The semiconductor structure includes a substrate, an interfacial layer formed over the substrate, and an insertion layer formed over the interfacial layer. The semiconductor structure further includes a gate dielectric layer formed over the insertion layer and a gate structure formed over the gate dielectric layer. In addition, the insertion layer is made of $M^1O_x$, and $M^1$ is a metal, O is oxygen, and x is a value greater than 4.

20 Claims, 13 Drawing Sheets

(56) References Cited

U.S. PATENT DOCUMENTS

| | | | |
|---|---|---|---|
| 2014/0319619 A1 | 10/2014 | Lin | |
| 2014/0346495 A1* | 11/2014 | Shieh | H01L 29/66742 257/43 |
| 2015/0053966 A1* | 2/2015 | Steiger | H01L 21/02472 257/43 |
| 2015/0104933 A1 | 4/2015 | Tsai et al. | |
| 2015/0145073 A1 | 5/2015 | Lee et al. | |
| 2015/0340498 A1* | 11/2015 | Tateshita | H01L 29/7836 257/190 |

* cited by examiner

SEMICONDUCTOR STRUCTURE WITH INSERTION LAYER AND METHOD FOR MANUFACTURING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
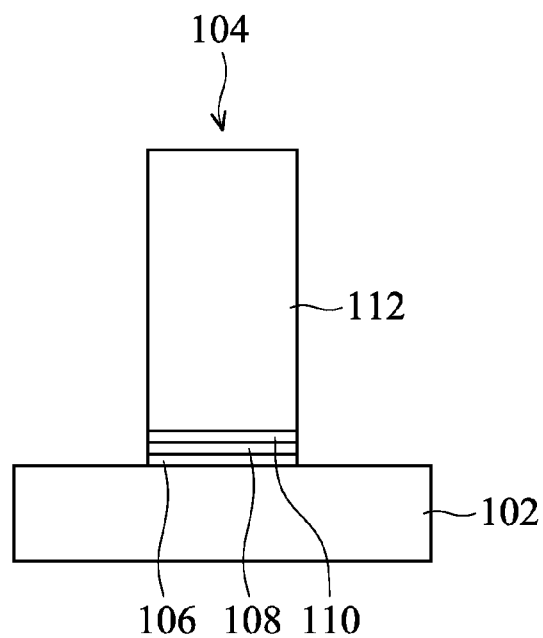
FIGS. 1A to 1D are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for manufacturing the same are provided. The semiconductor structure includes an insertion layer formed between an interfacial layer and a gate dielectric layer. The insertion layer is made of metal oxide, and the oxygen in the insertion layer can complement the oxygen vacancy in the gate dielectric layer.

FIGS. 1A to 1D are cross-sectional representations of various stages of forming a semiconductor structure 100a in accordance with some embodiments. As shown in FIG. 1A, a substrate 102 is received in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

A dummy gate structure 104 is formed over substrate 102, as shown in FIG. 1A in accordance with some embodiments. Dummy gate structure 104 includes an interfacial layer 106, an insertion layer 108, a gate dielectric layer 110, and a dummy gate electrode layer 112 in accordance with some embodiments.

In some embodiments, interfacial layer 106 is made of $SiO_2$, $GeO_2$, HfSiO, SiON, or the like. In some embodiments, interfacial layer 106 has a thickness in a range from about 2 Å to about 50 Å. Interfacial layer 106 may be formed by performing an atomic layer deposition (ALD) process, thermal oxidation process, UV-Ozone oxidation process, or chemical vapor deposition (CVD) process.

Insertion layer 108 is formed over interfacial layer 106, and gate dielectric layer 110 is formed over insertion layer 108, as shown in FIG. 1A in accordance with some embodiments. Insertion layer 108 may be formed to complement the oxygen vacancy in gate dielectric layer 110. Accordingly, the material used to form insertion layer 108 may contain more oxygen than that used to form gate dielectric layer 110 does. In some embodiments, insertion layer 108 and gate dielectric layer 110 are both made of metal oxide, but the metal oxide which is used to form insertion layer 108 has a higher coordination number than that of the metal oxide which is used to form gate dielectric layer 110.

In some embodiments, insertion layer 108 is made of $M^1O_x$. $M^1$ is a metal. In some embodiments, $M^1$ is selected from Hf, Al, Y, Ga, Sc, La, Ce, Pr, Nd, Pm, Sm, Eu, Gd, Tb, Dy, Ho, Er, Tm, Yb, or Lu. O is oxygen. In some embodiments, x is a value greater than 4. In some embodiments, x is in a range from about 5 to about 10. As described above, insertion layer 108 may be formed to complement the oxygen vacancy in gate dielectric layer 110, and therefore x should be high enough so that insertion layer 108 can provide enough oxygen to repair the oxygen vacancy in gate dielectric layer 110. However, x should not be too high, or the dielectric constant of insertion layer 108 may become too high and the performance of the gate structure formed over it in subsequent manufacturing processes may be affected.

In some embodiments, gate dielectric layer 110 is made of $M^2O_y$. $M^2$ is a metal. In some embodiments, $M^2$ is selected from Hf, Al, Y, Ga, Sc, La, Ce, Pr, Nd, Pm, Sm, Eu, Gd, Tb, Dy, Ho, Er, Tm, Yb, or Lu. O is oxygen. In some embodiments, y is less than 5. In some embodiments, y is in a range from about 1 to 4. In some embodiments, $M^1$ and $M^2$ are the same metals, but the coordination numbers of the materials used to form insertion layer 108 and gate dielectric layer 110 are different. For example, insertion layer 108 is made of $M^1O_x$, and gate dielectric layer 110 is made of $M^1O_y$. In addition, x is greater than y. In some embodiments, insertion layer 108 is made of $HfO_x$, and gate dielectric layer 110 is made of $HfO_y$, while x is equal to, or greater than, 5 and y is equal to, or less than, 4.

In some embodiments, the dielectric constant of gate dielectric layer 110 is greater than the dielectric constant of insertion layer 108. In some embodiments, the dielectric constant of gate dielectric layer 110 is in a range from 18 to 25. In some embodiments, the dielectric constant of insertion layer 108 is in a range from 13 to 17. In some embodiments, the dielectric constant of insertion layer 108 is greater than the dielectric constant of interfacial layer.

In some embodiments, $M^1{}_mO_n$, $M^1$ is a metal, O is oxygen, m is a value in a range from about 1 to about 2, and n is a value in a range from about 1 to about 3. In some embodiments, $M^1$ is Hf, Al, Y, Ga, Sc, La, Ce, Pr, Nd, Pm, Sm, Eu, Gd, Tb, Dy, Ho, Er, Tm, Yb, or Lu. In some embodiments, a ratio of n to m is in a range from about 5 to about 10.

In some embodiments, insertion layer 108 has a thickness in a range from about 1 Å to about 15 Å. Insertion layer 108 should be thick enough so that it can provide efficient oxygen to repair the oxygen vacancy of gate dielectric layer 110. However, insertion layer 108 should not be too thick, or the capacitance of the semiconductor structure may be too high and the performance of the semiconductor structure may be undermined accordingly. Insertion layer 108 may be formed by annealing, chemical vapor deposition (CVD), physical vapor deposition, (PVD), atomic layer deposition (ALD), spin-on coating, or other applicable processes. Gas, such as $N_2$, $H_2$, $O_2$, $N_2O$, and/or $H_2O$, may be used during the process for forming insertion layer 108.

In some embodiments, gate dielectric layer 110 is made of a high-k dielectric material. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. Gate dielectric layer 110 may be formed by chemical vapor deposition (CVD), physical vapor deposition, (PVD), atomic layer deposition (ALD), spin-on coating, or other applicable processes. In some embodiments, gate dielectric layer 110 has a thickness in a range from about 10 Å to about 50 Å.

Dummy gate electrode layer 112 is formed over gate dielectric layer 110, as shown in FIG. 1A in accordance with some embodiments. In some embodiments, dummy gate electrode layer 112 is made of polysilicon. Dummy gate structure 104 may be formed by depositing interfacial layer 106, insertion layer 108, gate dielectric layer 110, and dummy gate electrode layer 112 sequentially and patterning these material layers to form dummy gate structure 104.

Figure 1B:
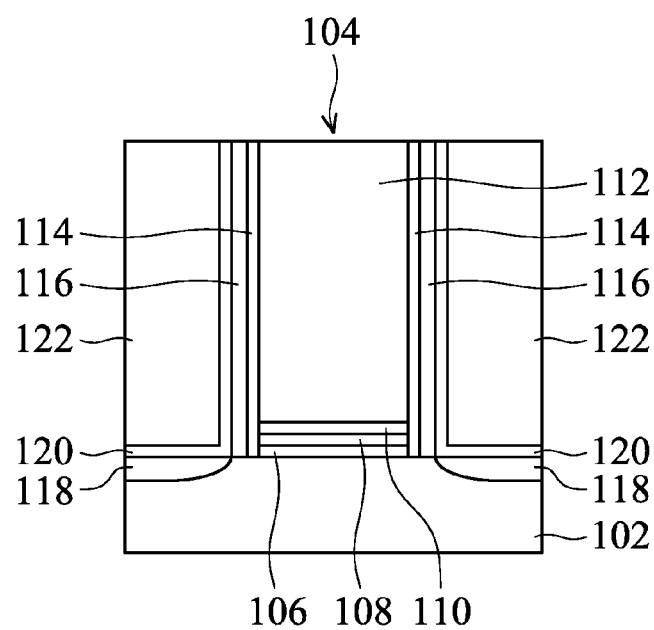

After dummy gate structure 104 is formed, sealing layers 114 are formed on the sidewalls of dummy gate structure 104, as shown in FIG. 1B in accordance with some embodiments. Sealing layer 114 may protect dummy gate structure 104 from damage or loss during subsequent processing and may also prevent oxidation during subsequent processing. In some embodiments, sealing layer 114 is made of silicon nitride, silicon oxide, silicon oxynitride, silicon carbide, or other applicable dielectric materials. Sealing layer 114 may include a single layer or multiple layers.

Spacers 116 are further formed on sealing layer 112 in accordance with some embodiments. In some embodiments, spacers 116 are made of silicon nitride, silicon oxide, silicon carbide, silicon oxynitride, or other applicable materials. Source/drain structures 118 are formed in substrate 102 and is positioned adjacent to dummy gate structure 104, as shown in FIG. 1B in accordance with some embodiments. In some embodiments, source/drain structures 118 are formed by using an implantation process or an epitaxial (epi) process. In some embodiments, source/drain structures 118 include Ge, SiGe, InAs, InGaAs, InSb, GaAs, GaSb, InAlP, InP, or the like.

After source/drain structures 118 are formed in substrate 102, a contact etch stop layer (CESL) 120 is formed over substrate 102, and an interlayer dielectric layer 122 is formed over contact etch stop layer 120, as shown in FIG. 1B in accordance with some embodiments. As shown in FIG. 1B, contact etch stop layer 120 is formed on the sidewalls of spacers 116 and the top surface of source/drain structures 118 in accordance with some embodiments. In some embodiments, contact etch stop layer 120 is made of silicon nitride, silicon oxynitride, and/or other applicable materials. Contact etch stop layer 120 may be formed by chemical vapor deposition (CVD), physical vapor deposition, (PVD), atomic layer deposition (ALD), spin-on coating, or other applicable processes.

In some embodiments, interlayer dielectric layer 122 is made of silicon oxide, silicon nitride, phosphosilicate glass (PSG), borophosphosilicate glass (BPSG), and/or other applicable dielectric materials. Interlayer dielectric layer 122 may be formed by chemical vapor deposition (CVD), physical vapor deposition, (PVD), atomic layer deposition (ALD), spin-on coating, or other applicable processes.

Figure 1C:
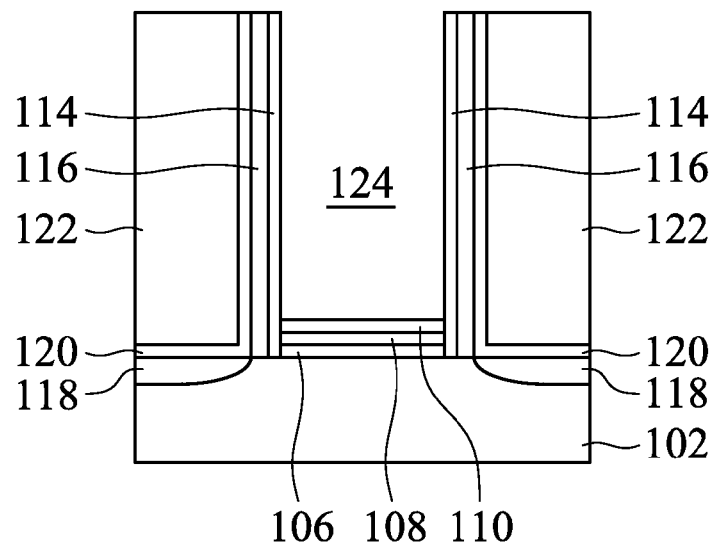

After interlayer dielectric layer 122 is formed, dummy gate electrode layer 112 is removed to form a trench 124 between spacers 116, as shown in FIG. 1C in accordance with some embodiments. Afterwards, a gate structure 126 is formed in trench 124, as shown in FIG. 1D in accordance with some embodiments.

In some embodiments, gate structure 126 includes a work functional metal layer 128 and a metal gate electrode layer 130. Work function metal layer 128 is tuned to have a proper work function. In some embodiments, work function metal layer 128 is made of metal nitride. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

In some embodiments, metal gate electrode layer 130 is made of a conductive material, such as a metal. Examples of the conductive materials used to form metal gate electrode 130 may include, but are not limited to, aluminum, copper, tungsten, titanium, tantalum, or other applicable materials. As described previously, in subsequent processes, the metal of metal gate electrode layer 130 may diffuse toward the layers formed below.

Figure 1D:
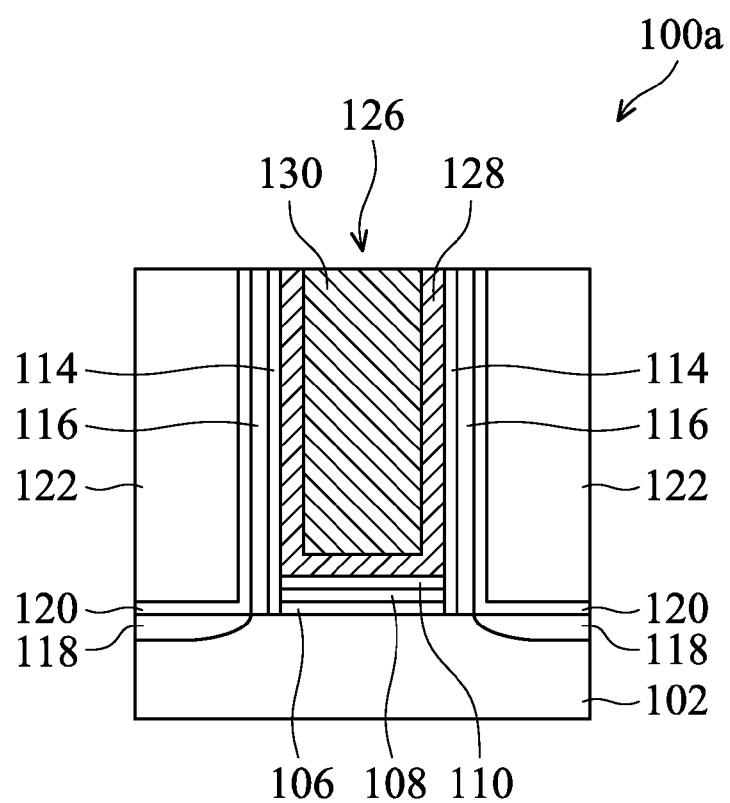

As shown in FIG. 1D, semiconductor structure 100a includes insertion layer 108 positioned between interfacial layer 106 and gate dielectric layer 110. The oxygen in insertion layer 108 can complement the oxygen vacancy in gate dielectric layer 110, so that the threshold voltage of gate structure 126 will not be affected by the oxygen vacancy in gate dielectric layer 110. Accordingly, the resulting semiconductor structure can have a better uniformity, and the yield of manufacturing semiconductor structures 100a can be improved.

Figure 2A:
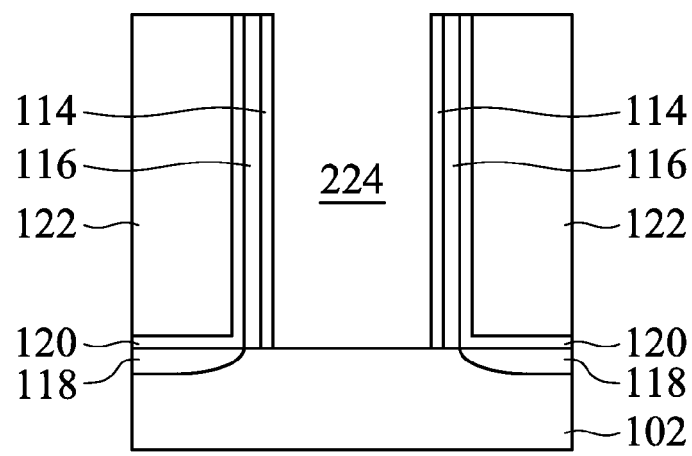
FIGS. 2A to 2B are cross-sectional representations of various stages of forming a semiconductor structure in accordance with some embodiments.
Figure 2B:
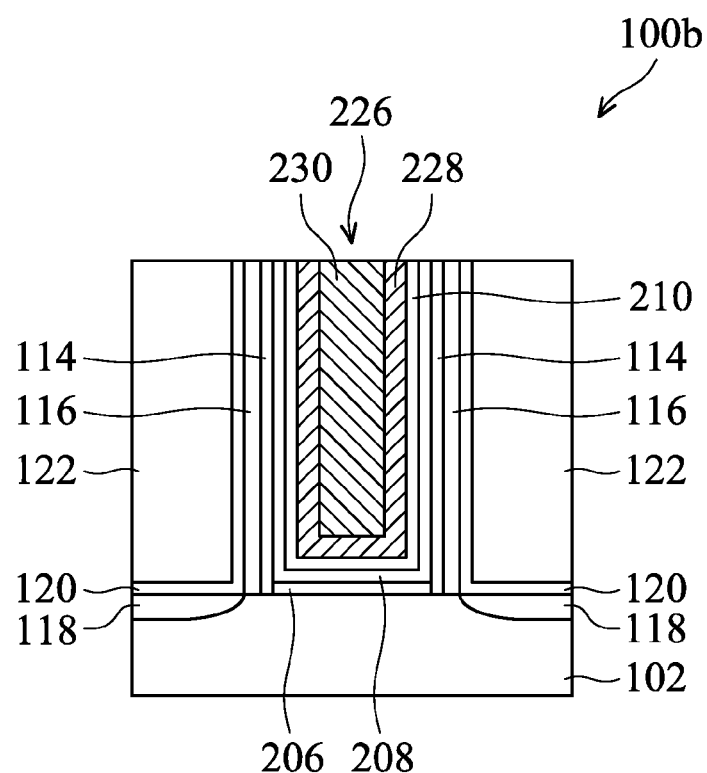

FIGS. 2A to 2B are cross-sectional representations of various stages of forming a semiconductor structure 100b in accordance with some embodiments. Some processes and materials used to form semiconductor structure 100b may be similar to, or the same as, those used to form semiconductor structure 100a described previously and are not repeated herein.

The method for forming semiconductor structure 100b is similar to that of forming semiconductor structure 100a, except its interfacial layer, insertion layer, and gate dielectric layer are formed after the dummy gate structure is removed. Similar to those shown in FIGS. 1A to 1C, a dummy gate structure is formed over substrate 102, and sealing layer 114 and spacers 116 are formed on the sidewalls of the dummy gate structure. In addition, source/drain structure 118 is formed in substrate 102, and contact etch stop layer 120 and interlayer dielectric layer 122 are formed over substrate 102. Afterwards, the dummy gate structure is removed to form a trench 224, as shown in FIG. 2A in accordance with some embodiments.

Unlike the structure shown in FIG. 1C, the dummy gate structure is completely removed, and therefore the top surface of substrate 102 is exposed by trench 224. After trench 224 is formed, an interfacial layer 206 is formed on the bottom surface of trench 224. Processes and materials used to form interfacial layer 206 may be similar to, or the same as, those used to form interfacial layer 106 described previously and are not repeated herein.

After interfacial layer 206 is formed, an insertion layer 208 is formed on the top surface of interfacial layer 206 and on the sidewalls of trench 224, as shown in FIG. 2B in accordance with some embodiments. Processes and materials used to form insertion layer 208 may be similar to, or the same as, those used to form insertion layer 108 described previously and are not repeated herein. In some embodiments, insertion layer 208 is formed by performing a CVD process.

After insertion layer 208 is formed, a gate dielectric layer 210 is formed over insertion layer 208, as shown in FIG. 2B in accordance with some embodiments. Processes and materials used to form gate dielectric layer 210 may be similar to, or the same as, those used to form gate dielectric layer 110 described previously and are not repeated herein.

Next, a gate structure 226 is formed over gate dielectric layer 210, as shown in FIG. 2B in accordance with some embodiments. Similar to gate structure 126, gate structure 226 includes a work function metal layer 228 and a metal gate electrode layer 230 formed over work function metal layer 228 in accordance with some embodiments. Processes and materials used to form work function metal layer 228 and metal gate electrode layer 230 may respectively be similar to, or the same as, those used to form work function metal layer 128 and metal gate electrode layer 130 described previously and are not repeated herein.

As shown in FIG. 2B, semiconductor structure 100b includes insertion layer 208 positioned between interfacial layer 206 and gate dielectric layer 210. As described previously, insertion layer 208 is formed to contain more oxygen than gate dielectric layer does, and therefore insertion layer 208 may be seen as an oxygen source for repairing the oxygen vacancy in gate dielectric layer 110. Accordingly, the performance of the resulting semiconductor structures 100b can be improved and better controlled.

Therefore, the oxygen vacancy in gate dielectric layer 210 can be repaired by the oxygen in insertion layer 208, and the uniformity of forming semiconductor structure 100b can be improved.

Figure 3:
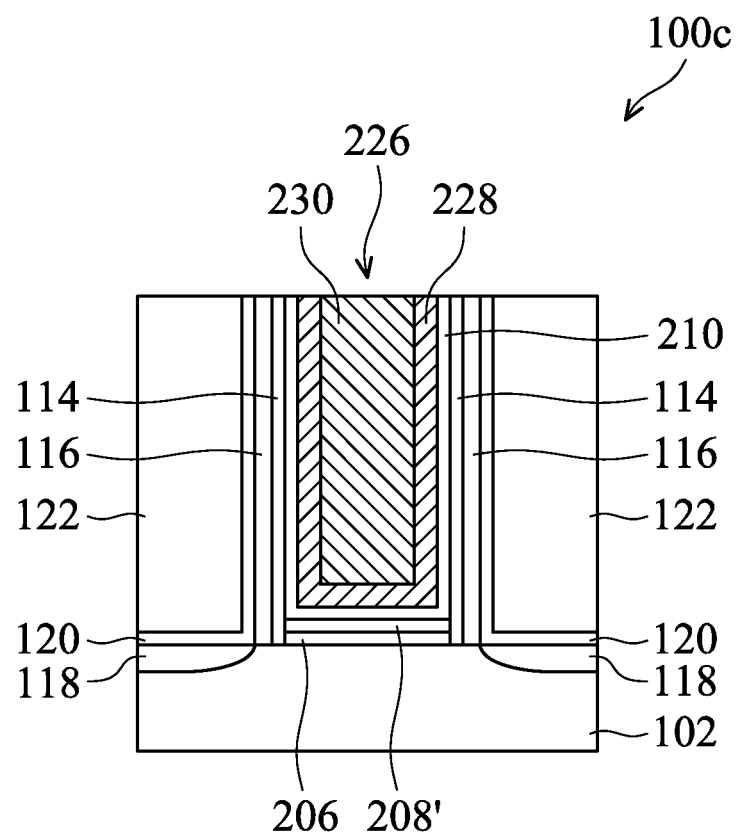
FIG. 3 is a cross-sectional representation of a semiconductor structure in accordance with some embodiments.

FIG. 3 is a cross-sectional representation of a semiconductor structure 100c in accordance with some embodiments. Semiconductor structure 100c is similar to, or the same as, semiconductor structure 100b, except the insertion layer is not formed on the sidewall of sealing layer 114.

More specifically, processes similar to those shown in FIG. 2A to 2B may be performed. However, instead of insertion layer 208, an insertion layer 208' is formed over interfacial layer 206. The material used to form insertion layer 208' may be similar to, or the same as, that used to form insertion layers 108 and 208 described previously and is not repeated herein. The difference between insertion layer 208' and insertion layer 208 is that insertion layer 208' is only formed on the top surface of interfacial layer 206 (i.e. on the bottom surface of the trench formed by removing the dummy gate structure) but not on the sidewalls of sealing layer 114 (i.e. on the sidewalls of the trench formed by removing the dummy gate structure). In some embodiments, insertion layer 208' is formed by performing a thermal process.

Figure 4A:
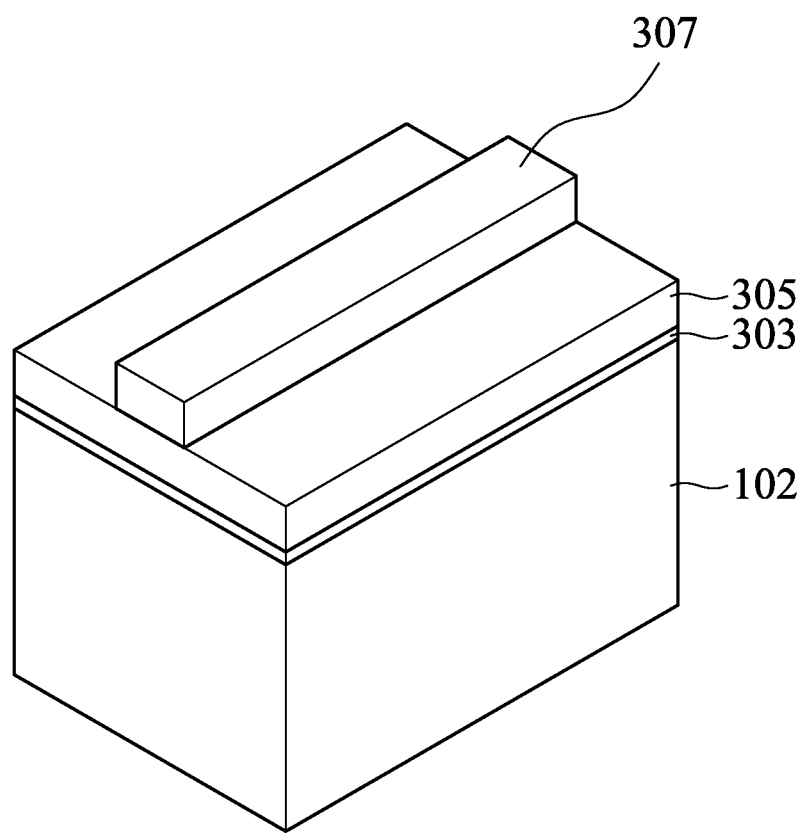
FIGS. 4A to 4H are perspective views of various stages of forming a semiconductor structure in accordance with some embodiments.

FIGS. 4A to 4H are perspective views of various stages of forming a semiconductor structure 100d in accordance with some embodiments. As shown in FIG. 4A, a dielectric layer 303 and a mask layer 305 are formed over substrate 102, and a photo-sensitive layer 307 is formed over mask layer 305, as shown in FIG. 4A in accordance with some embodiments. Dielectric layer 303 may be used as an adhesion layer between substrate 102 and mask layer 305. In addition, dielectric layer 303 may also be used as an etch stop layer for etching mask layer 305. In some embodiments, dielectric layer 303 is made of silicon oxide. Dielectric layer 305 may be formed by using a thermal oxidation process, although other deposition processes may be used in some other embodiments.

Mask layer 305 may be used as a hard mask during subsequent photolithography processes. In some embodiments, mask layer 305 is made of silicon nitride. Mask layer 305 may be formed by using low-pressure chemical vapor deposition (LPCVD) or plasma enhanced chemical vapor deposition (PECVD), although other deposition processes may also be used in some other embodiments.

Figure 4B:
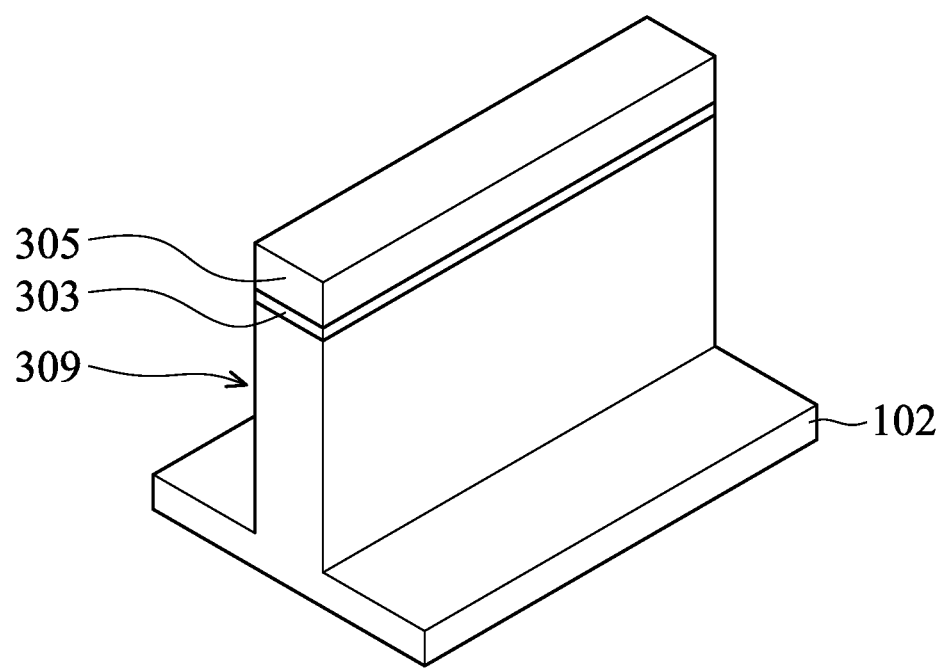
Figure 4C:
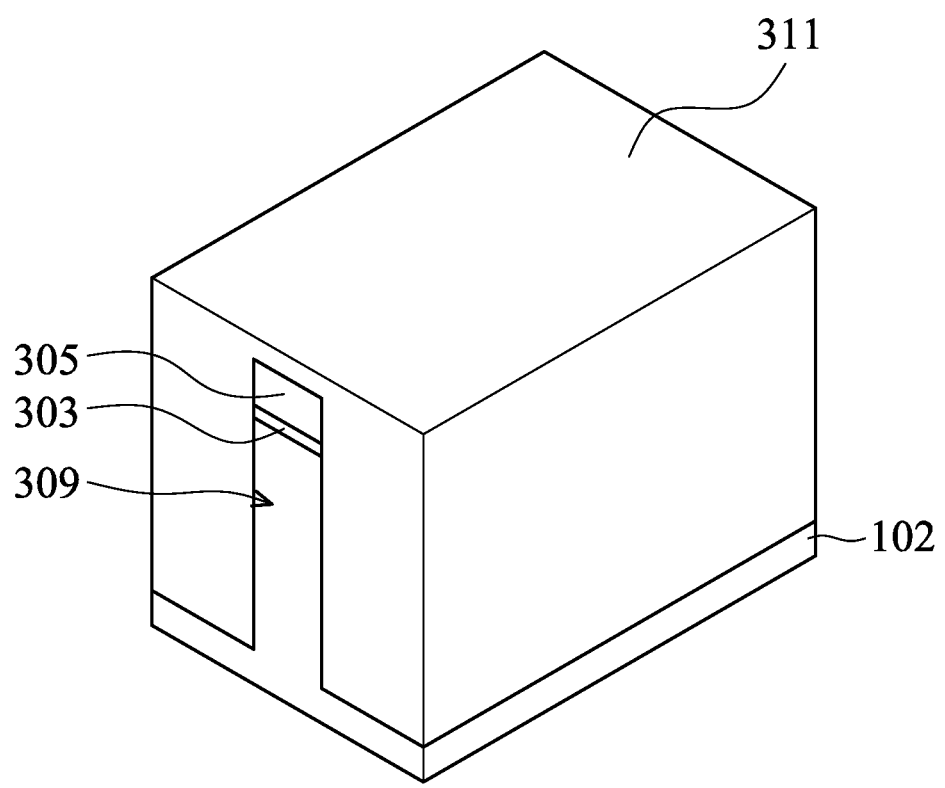

Next, a fin structure 309 is formed by sequentially etching mask layer 305, dielectric layer 303, and substrate 302 through photo-sensitive layer 307, as shown in FIG. 4B in accordance with some embodiments. Afterwards, photo-sensitive layer 307 is removed. After fin structure 309 is formed, an insulating layer 311 is formed over substrate 102, as shown in FIG. 4C in accordance with some embodiments. As shown in FIG. 4C, fin structure 309 may be covered by insulating layer 311. In some embodiments, insulating layer 311 is made of silicon oxide, silicon nitride, silicon oxynitride, fluoride-doped silicate glass (FSG), or other low-K dielectric materials. Insulating layer 311 may be formed by using a high-density-plasma (HDP) CVD process, although other deposition processes may be used in other embodiments.

Figure 4D:
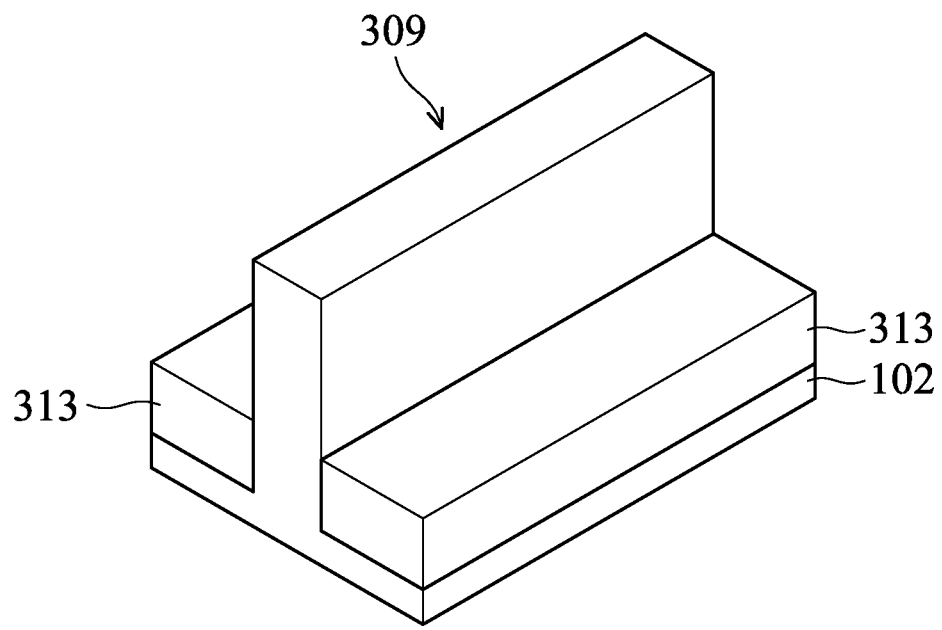

Next, insulating layer 311 is recessed to form an isolation structure 313, such as a shallow trench isolation structure, around fin structure 309, as shown in FIG. 4D in accordance with some embodiments. Insulating layer 311 may be recessed by a wet etching process or a dry etching process. In addition, mask layer 306 and dielectric layer 304 are removed.

Afterwards, a dummy gate structure 304 is formed across fin structure 309 and extends over isolation structure 313. In some embodiments, dummy gate structure 304 includes a dummy gate dielectric layer 306 and a dummy gate electrode layer 312 formed over dummy gate dielectric layer 306. In some embodiments, dummy gate dielectric layer 306 is made of silicon oxide. In some embodiments, dummy gate dielectric layer 306 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, dummy gate electrode layer 312 is made of polysilicon.

Figure 4E:
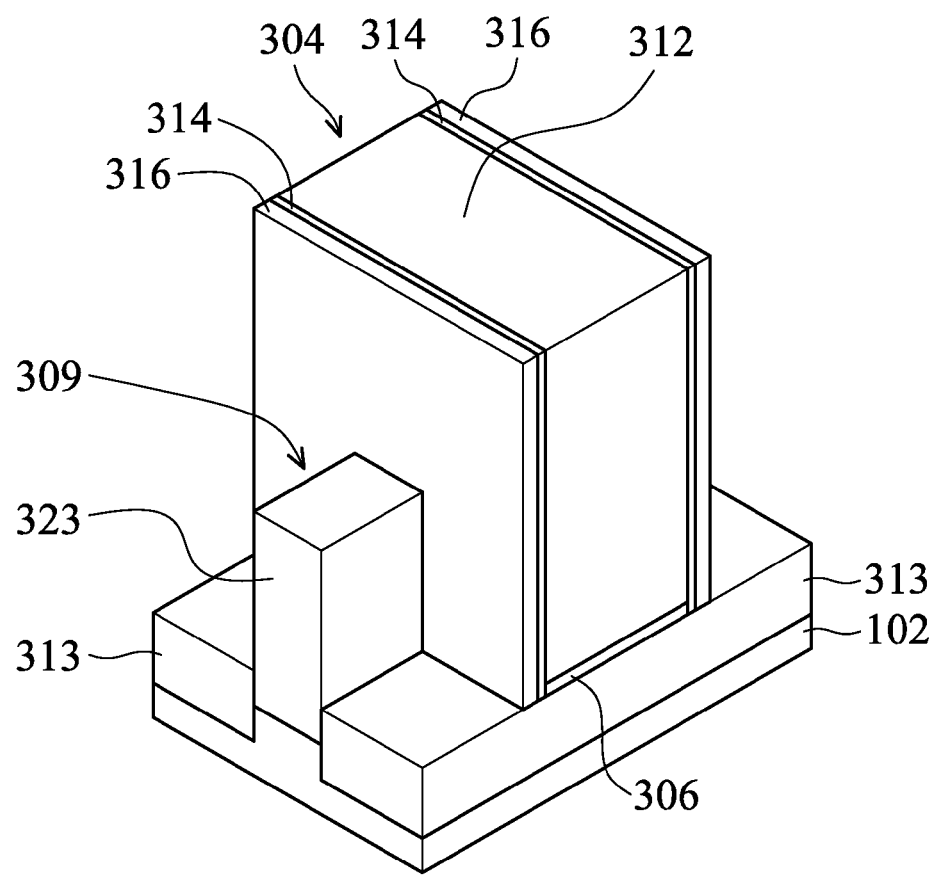

After dummy gate structure 304 is formed, sealing layers 314 and spacers 316 are formed on the sidewalls of dummy gate structure 304, as shown in FIG. 4E in accordance with some embodiments. Processes and materials used to form sealing layer 314 and spacers 316 may be similar to, or the same as, those used to form sealing layer 114 and spacers 116 described previously and are not repeated herein.

Next, source/drain structures 323 are formed in fin structure 309, as shown in FIG. 4E in accordance with some embodiments. In some embodiments, portions of fin structure 309 adjacent to dummy gate structure 304 are recessed to form recesses at two sides of fin structure 309, and a strained material is grown in the recesses by an epitaxial (epi) process. In addition, the lattice constant of the strained material may be different from the lattice constant of substrate 102. In some embodiments, source/drain structures 323 include Ge, SiGe, InAs, InGaAs, InSb, GaAs, GaSb, InAlP, InP, or the like.

Figure 4F:
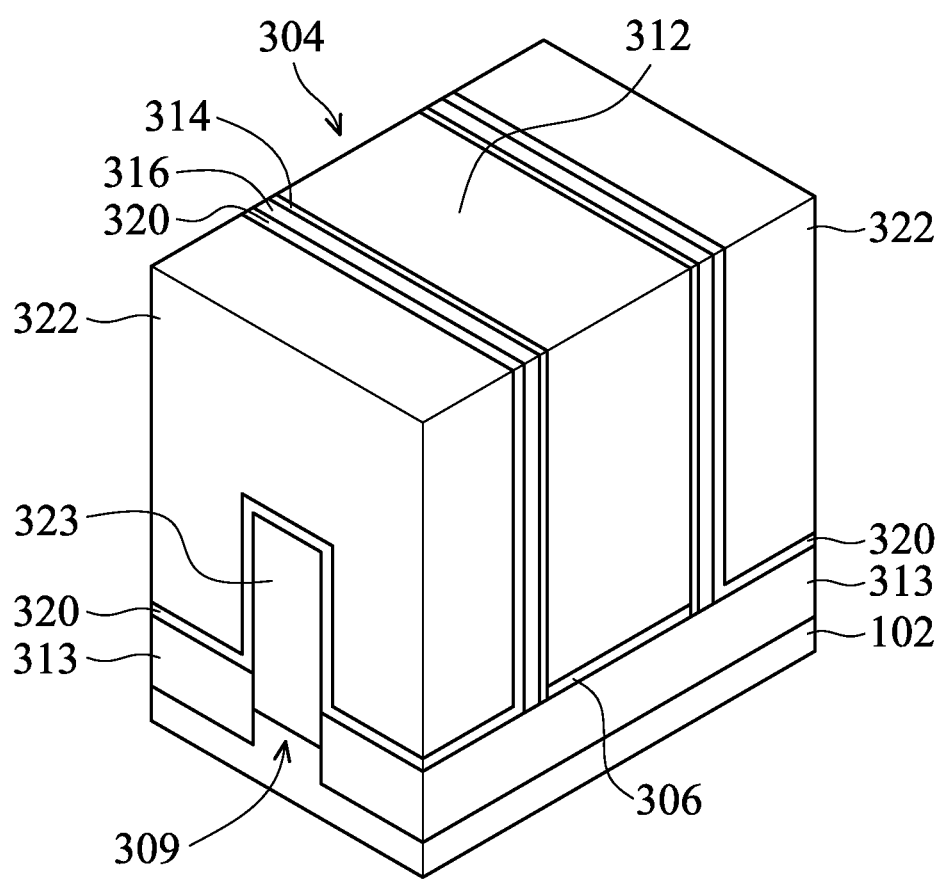

After source/drain structures 323 are formed, a contact etch stop layer (CESL) 320 is formed over substrate 102, and an interlayer dielectric (ILD) layer 322 is formed over contact etch stop layer 320, as shown in FIG. 4F in accordance with some embodiments. Processes and materials used to form contact etch stop layer 320 and interlayer dielectric layer 322 may be similar to, or the same as, those used to form contact etch stop layer 120 and interlayer dielectric layer 122 described previously and are not repeated herein.

Next, a polishing process is performed on interlayer dielectric layer 322 and contact etch stop layer 320 to expose the top surface of dummy gate structure 304 in accordance with some embodiments. In some embodiments, a chemical mechanical polishing (CMP) process is performed until the top surface of dummy gate structure 304 is exposed.

Figure 4G:
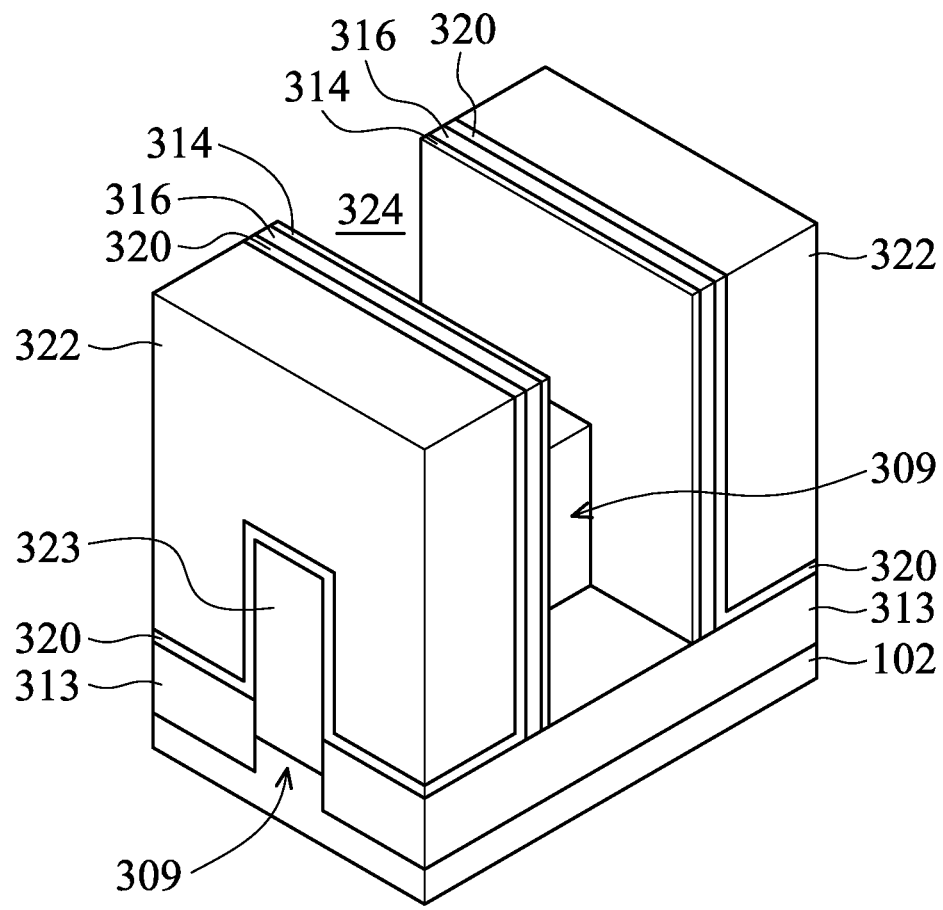

After the polishing process is performed, dummy gate structure 304 is removed, such that a trench 324 is formed, as shown in FIG. 4G in accordance with some embodiments. In some embodiments, dummy gate structure 304 is removed by performing a dry etching process. In some embodiments, dummy gate structure 304 is removed by performing a dry etching process and a wet etching process.

Figure 4H:
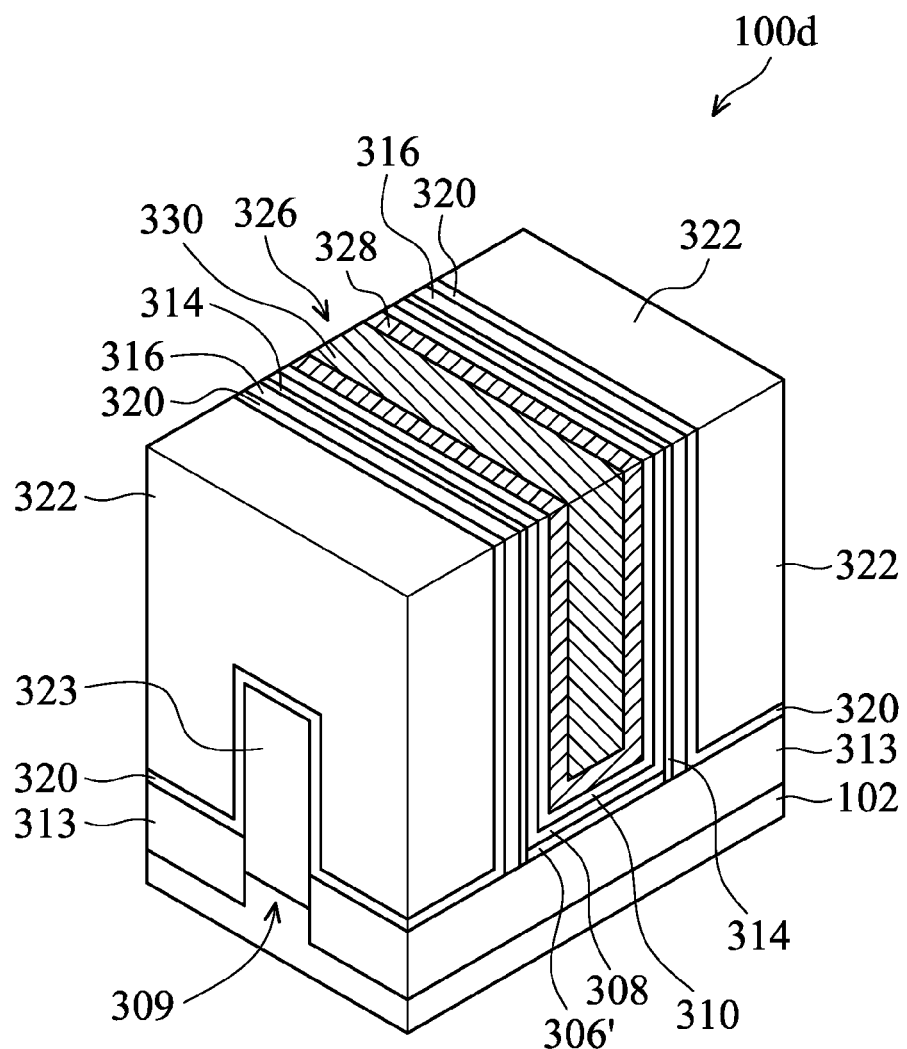

After trench 324 is formed, an interfacial layer 306' is formed on the bottom surface of trench 324, as shown in FIG. 4H in accordance with some embodiments. Processes and materials used to form interfacial layer 306' may be similar to, or the same as, those used to form interfacial layers 106 and 206 described previously and are not repeated herein.

After interfacial layer 306' is formed, an insertion layer 308 is formed on the top surface of interfacial layer 306' and on the sidewalls of trench 324, as shown in FIG. 4H in accordance with some embodiments. Processes and materials used to form insertion layer 308 may be similar to, or the same as, those used to form insertion layers 108, 208, and 208' described previously and are not repeated herein. In some embodiments, insertion layer 308 is formed by performing a CVD process.

After insertion layer 308 is formed, a gate dielectric layer 310 is formed over insertion layer 308, as shown in FIG. 4H in accordance with some embodiments. Processes and materials used to form gate dielectric layer 310 may be similar to, or the same as, those used to form gate dielectric layers 110 and 210 described previously and are not repeated herein.

Next, a gate structure 326 is formed over gate dielectric layer 310, as shown in FIG. 4H in accordance with some embodiments. Similar to gate structure 126, gate structure 326 includes a work function metal layer 328 and a metal gate electrode layer 330 formed over work function metal layer 328 in accordance with some embodiments. Processes and materials used to form work function metal layer 328 and metal gate electrode layer 330 may respectively be similar to, or the same as, those used to form work function metal layers 128 and 228 and metal gate electrode layers 130 and 230 described previously and are not repeated herein.

As shown in FIG. 4H, semiconductor structure 100d includes insertion layer 308 positioned between interfacial layer 306' and gate dielectric layer 310. As described previously, the oxygen vacancy in gate dielectric layer 310 can be repaired by the oxygen in insertion layer 308, and the yield of forming semiconductor structure 100d can be improved.

Figure 5:
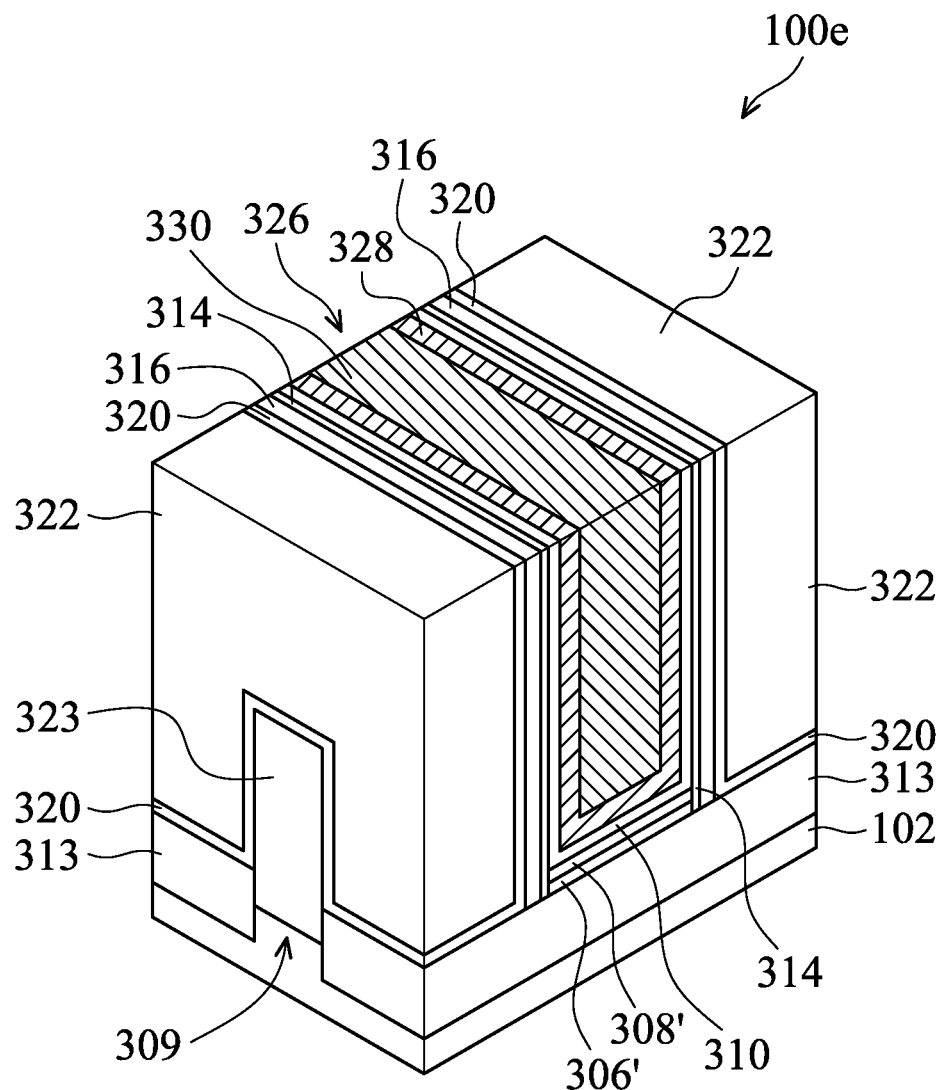
FIG. 5 is a cross-sectional representation of a semiconductor structure in accordance with some embodiments.

FIG. 5 is a cross-sectional representation of a semiconductor structure 100e in accordance with some embodiments. Semiconductor structure 100e is similar to, or the same as, semiconductor structures 100d, except the insertion layer is not formed on the sidewall of sealing layer 114 (similar to semiconductor structure 100c).

More specifically, processes similar to those shown in FIG. 4A to 4H may be performed. However, instead of insertion layer 308, an insertion layer 308' is formed over interfacial layer 306'. The material used to form insertion layer 308' may be similar to, or the same as, that used to form insertion layers 108, 208, 208', and 308 described previously and is not repeated herein. The difference between insertion layer 308' and insertion layer 308 is that insertion layer 308' is only formed on the top surface of interfacial layer 306' (i.e. on the bottom surface of trench 324) but not on the sidewalls of sealing layer 314 (i.e. on the sidewalls of trench 324). In some embodiments, insertion layer 308' is formed by performing a thermal process.

Generally, a gate structure in a semiconductor structure includes a gate dielectric layer and a gate electrode layer formed over the gate dielectric layer. However, when the gate dielectric layer is made of a high-k dielectric material, such as a metal oxide, oxygen vacancy may be formed in the gate dielectric layer during the processes for manufacturing the gate structure. The oxygen vacancy may draw negative electrons on the top surface of the substrate and induce an internal electric field. That is, the work function value of the gate structure may be affected by the internal electric field and the uniformity of the resulting semiconductor structure may be poor.

Accordingly, in some embodiments of the disclosure, an insertion layer (e.g. insertion layers 108, 208, 208', 308, and 308') is positioned between an interfacial layer (e.g. interfacial layers 106, 206, and 306') and a gate dielectric layer (e.g. gate dielectric layers 110, 210, and 310). The insertion layer is made of a relatively oxygen-rich material, compared to the gate dielectric layer and therefore can be used to complement the oxygen vacancy in the gate dielectric layer. Accordingly, the threshold voltage and the work function value of the gate structure will not be affected by the oxygen vacancy in the gate dielectric layer, and the performance of the resulting semiconductor structure (e.g. semiconductor structures 100a to 100e) can be better controlled. In addition, uniformity and reliability of the semiconductor structure can also be improved, and the yield of the manufacturing processes can be increased.

In some embodiments, the insertion layer is made of a metal oxide such as $M^1O_x$ described previously and can be easily form by any known or future developed processes. That is, no complicated manufacturing process is required, and the cost of the manufacturing process may be relatively low.

Embodiments of a semiconductor structure and methods for manufacturing the same are provided. The semiconductor structure includes an interfacial layer, an insertion layer, and a gate dielectric layer formed over a substrate. A gate structure is formed over the gate dielectric layer. The insertion layer is positioned between the interfacial layer and the gate dielectric layer. The insertion layer is made of a metal oxide which contains a relatively high oxygen therein, compared to the material used to form the gate dielectric layer. Therefore, the insertion layer may be used to complement the oxygen vacancy in the gate dielectric layer, and the threshold voltage of the gate structure formed over the gate dielectric layer may be better controlled. Accordingly, the semiconductor structure may have an improved uniformity, and the yield of the process for manufacturing the semiconductor structure may increase.

In some embodiments, a semiconductor structure is provided. The semiconductor structure includes a substrate, an interfacial layer formed over the substrate, and an insertion layer formed over the interfacial layer. The semiconductor structure further includes a gate dielectric layer formed over the insertion layer and a gate structure formed over the gate dielectric layer. In addition, the insertion layer is made of $M^1O_x$, and $M^1$ is a metal, O is oxygen, and x is a value greater than 4.

In some embodiments, a semiconductor structure is provided. The semiconductor structure includes a substrate and an interfacial layer formed over the substrate. The semiconductor structure further includes an insertion layer formed over the interfacial layer and a gate dielectric layer formed over the insertion layer. The semiconductor structure further includes a gate structure formed over the gate dielectric layer. In addition, the insertion layer is made of a $M^1O_x$, the gate dielectric layer is made of $M^2O_y$, and wherein $M^1$ is a metal, $M^2$ is a metal, O is oxygen, and x is a number greater than y.

In some embodiments, a method for manufacturing a semiconductor structure is provided. The method for manufacturing a semiconductor structure includes forming an interfacial layer over a substrate. The method for manufacturing a semiconductor structure further includes forming an insertion layer over the interfacial layer and forming a gate dielectric layer over the insertion layer. The method for manufacturing a semiconductor structure further includes forming a gate structure over the gate dielectric layer. In addition, the insertion layer is made of $M^1{}_mO_n$, $M^1$ is a metal, O is oxygen, m is a value in a range from about 1 to about 2, and n is a value in a range from about 1.2 to about 3.5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   an interfacial layer formed over the substrate;
   an insertion layer formed over the interfacial layer;
   a gate dielectric layer formed over the insertion layer; and
   a gate structure formed over the gate dielectric layer,
   wherein the insertion layer is made of $M^1O_x$, and $M^1$ is a metal, O is oxygen, and x is a value greater than 4.

2. The semiconductor structure as claimed in claim 1, wherein $M^1$ is selected from Hf, Al, Y, Ga, Sc, La, Ce, Pr, Nd, Pm, Sm, Eu, Gd, Tb, Dy, Ho, Er, Tm, Yb, or Lu.

3. The semiconductor structure as claimed in claim 1, wherein the gate dielectric layer is made of $M^2O_y$, $M^2$ is a metal, and y is in a range from about 1 to 4.

4. The semiconductor structure as claimed in claim 3, wherein x is in a range from about 5 to about 10.

5. The semiconductor structure as claimed in claim 1, wherein a dielectric constant of the gate dielectric layer is greater than a dielectric constant of the insertion layer.

6. The semiconductor structure as claimed in claim 1, wherein the gate dielectric layer is made of $M^1O_y$, and y is in a range from about 1 to 4.

7. The semiconductor structure as claimed in claim 1, wherein a thickness of the insertion layer is in a range from about 1 Å to about 15 Å.

8. A semiconductor structure, comprising:
   a substrate;
   an interfacial layer formed over the substrate;
   an insertion layer formed over the interfacial layer;
   a gate dielectric layer formed over the insertion layer; and
   a gate structure formed over the gate dielectric layer,
   wherein the insertion layer is made of a $M^1O_x$, the gate dielectric layer is made of $M^2O_y$, and wherein $M^1$ is a metal, $M^2$ is a metal, O is oxygen, and x is a number greater than y.

9. The semiconductor structure as claimed in claim 8, wherein x is in a range from about 5 to about 10.

10. The semiconductor structure as claimed in claim 8, wherein y is in a range from about 1 to about 4.

11. The semiconductor structure as claimed in claim 8, wherein $M^1$ and $M^2$ are individually selected from Hf, Al, Y, Ga, Sc, La, Ce, Pr, Nd, Pm, Sm, Eu, Gd, Tb, Dy, Ho, Er, Tm, Yb, or Lu.

12. The semiconductor structure as claimed in claim 8, wherein $M^1$ and $M^2$ are the same metal.

13. The semiconductor structure as claimed in claim 8, wherein a dielectric constant of the gate dielectric layer is greater than a dielectric constant of the insertion layer.

14. A method for manufacturing a semiconductor structure, comprising:
   forming an interfacial layer over a substrate;
   forming an insertion layer over the interfacial layer;
   forming a gate dielectric layer over the insertion layer; and
   forming a gate structure over the gate dielectric layer,
   wherein the insertion layer is made of $M^1_m O_n$, $M^1$ is a metal, O is oxygen, m is a value in a range from about 1 to about 2, and n is a value in a range from about 1.2 to about 3.5.

15. The method for manufacturing a semiconductor structure as claimed in claim 14, wherein a ratio of n to m is in a range from about 5 to about 10.

16. The method for manufacturing a semiconductor structure as claimed in claim 14, wherein $M^1$ is selected from Hf, Al, Y, Ga, Sc, La, Ce, Pr, Nd, Pm, Sm, Eu, Gd, Tb, Dy, Ho, Er, Tm, Yb, or Lu.

17. The method for manufacturing a semiconductor structure as claimed in claim 14, wherein the gate structure comprises:
   a work function metal layer formed over the gate dielectric layer; and
   a gate electrode layer formed over the work function metal layer.

18. The method for manufacturing a semiconductor structure as claimed in claim 14, wherein a dielectric constant of the gate dielectric layer is greater than a dielectric constant of the insertion layer.

19. The method for manufacturing a semiconductor structure as claimed in claim 14, wherein the insertion layer is made of $HfO_n$, and the gate dielectric layer is made of $HfO_p$, and p is in a range of about 1 to about 4.

20. The method for manufacturing a semiconductor structure as claimed in claim 14, wherein a dielectric constant of the insertion layer is greater than a dielectric constant of the interfacial layer.

* * * * *